United States Patent
Xu et al.

(10) Patent No.: US 10,666,243 B2
(45) Date of Patent: May 26, 2020

(54) HIGH-SPEED LOW-POWER-CONSUMPTION DYNAMIC COMPARATOR

(71) Applicant: CHINA ELECTRONIC TECHNOLOGY CORPORATION, 24TH RESEARCH INSTITUTE, Chongqing (CN)

(72) Inventors: Dai-Guo Xu, Chongqing (CN); Gang-Yi Hu, Chongqing (CN); Ru-Zhang Li, Chongqing (CN); Jian-An Wang, Chongqing (CN); Guang-Bing Chen, Chongqing (CN); Yu-Xin Wang, Chongqing (CN); Dong-Bing Fu, Chongqing (CN); Tao Liu, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 30 days.

(21) Appl. No.: 16/475,123

(22) PCT Filed: Jul. 7, 2016

(86) PCT No.: PCT/CN2016/089044
§ 371 (c)(1),
(2) Date: Jun. 30, 2019

(87) PCT Pub. No.: WO2017/049989
PCT Pub. Date: Mar. 30, 2017

(65) Prior Publication Data
US 2019/0334514 A1    Oct. 31, 2019

(30) Foreign Application Priority Data

Sep. 25, 2015   (CN) .......................... 2015 1 0618825

(51) Int. Cl.
H03K 5/00 (2006.01)
H03K 5/24 (2006.01)
(Continued)

(52) U.S. Cl.
CPC ......... *H03K 5/2472* (2013.01); *H03K 19/003* (2013.01); *H03K 19/0013* (2013.01)

(58) Field of Classification Search
CPC ........ H03K 5/2481; H03K 5/02; H03K 5/249; H03K 5/2472; H03K 3/02337;
(Continued)

(56) References Cited

U.S. PATENT DOCUMENTS

| 7,729,188 B2 * | 6/2010 | Aipperspach .......... G11C 7/062 |
| | | 365/189.09 |
| 10,425,065 B2 * | 9/2019 | Xu ......................... H03K 3/012 |

FOREIGN PATENT DOCUMENTS

| CN | 103546127 A | 1/2014 |
| CN | 104124971 A | 10/2014 |

(Continued)

OTHER PUBLICATIONS

Daiguo Xu, Shiliu Xu, Guangbing Chen, "High-Speed Low-Power and Low-Power Supply Voltage Dynamic Comparator", Electronics Letters, Nov. 5, 2015, pp. 1914-1916, vol. 51, Issue No. 23.

*Primary Examiner* — Long Nguyen
(74) *Attorney, Agent, or Firm* — Cheng-Ju Chiang

(57) ABSTRACT

A high-speed low-power-consumption dynamic comparator includes a latch, an AND gate, a delay unit, and an XNOR gate. According to the high-speed low-power-consumption dynamic comparator, the output signal is generated through the XNOR gate from the comparator output signals Dp and Dn. The output signal and the control signal clk1 generate the control signal of the NMOS transistor P10 through the
(Continued)

AND gate, so that the problem of static power consumption in a conventional comparator is solved.

2 Claims, 7 Drawing Sheets

(51) Int. Cl.
*H03K 19/00* (2006.01)
*H03K 19/003* (2006.01)

(58) Field of Classification Search
CPC ............. H03K 3/3565; H03K 19/0013; H03K 19/003; G11C 7/062; G11C 7/065
See application file for complete search history.

(56) References Cited

FOREIGN PATENT DOCUMENTS

| | | |
|---|---|---|
| CN | 104300983 A | 1/2015 |
| CN | 105162441 A | 12/2015 |

* cited by examiner

HIGH-SPEED LOW-POWER-CONSUMPTION DYNAMIC COMPARATOR

CROSS REFERENCE TO RELATED APPLICATIONS

The present application is a 35 U.S.C. § 371 National Phase conversion of International (PCT) Patent Application No. PCT/CN2016/089044, filed on Jul. 7, 2016, which further claims benefit of Chinese Patent Application No. 201510618825.4, filed on Sep. 25, 2015, the disclosure of which is incorporated by reference herein. The PCT International Patent Application was filed and published in Chinese.

TECHNICAL FIELD

The present invention belongs to the technical field of analog or digital-analog hybrid integrated circuits, and particularly, to a high-speed low-power-consumption dynamic comparator.

BACKGROUND

In recent years, with the continuous development of the integrated circuit manufacturing technique, feature sizes of CMOS devices have been continuously decreased, and operating voltages of integrated circuits have been continuously reduced as well. Under a deep submicron process, an operating speed of analog-to-digital converters has been greatly improved. Meanwhile, the power consumption is further reduced. However, the performance of a comparator as a core component of the analog-to-digital converter becomes a bottleneck for high-speed low-power-consumption designs. It is difficult for traditional comparators to meet the requirements of speed, power consumption and low power supply voltage simultaneously.

SUMMARY

In view of this, the present invention provides a high-speed low-power-consumption dynamic comparator that still maintains a very low static power consumption while implementing a high-speed operation. Meanwhile, as a power supply voltage decreases, the comparator provided by the present invention still maintains a relatively high comparison speed compared with the above-described conventional comparator.

In order to achieve the above object, the present invention provides the following technical solution: a high-speed low-power-consumption dynamic comparator includes a first NMOS transistor, a second NMOS transistor, a sixth NMOS transistor, a delay unit, a first inverter, a second inverter, an XNOR gate, an AND gate and a latch, wherein the latch includes a first control end, a second control end, a third control end, a first output end, a second output end and a power supply end; the gate of the first NMOS transistor is connected with a first input signal, the gate of the second NMOS transistor is connected with a second input signal, and the source of the first NMOS transistor and the source of the second NMOS transistor are respectively connected with the drain of the sixth NMOS transistor, and the source of the sixth NMOS transistor is grounded; the drain of the first NMOS transistor is respectively connected with the input end of the second inverter and the second output end of the latch; the drain of the second NMOS transistor is respectively connected with the input end of the first inverter and the first output end of the latch; the output end of the first inverter is connected with one of input ends of the XNOR gate, the output end of the second inverter is connected with the other one of the input ends of the XNOR gate, the output end of the XNOR gate is connected with one of input ends of the AND gate, the input end of the delay unit is connected with the other one of the input ends of the AND gate, and the output end of the AND gate is connected with the gate of the sixth NMOS transistor; and the output end of the delay unit is connected with the third control end, the input end of the delay unit is respectively connected with the first control end and the second control end, respectively, and the power supply end is connected with a Vdd.

Further, the latch includes a third NMOS transistor, a fourth NMOS transistor, a fifth NMOS transistor, a first PMOS transistor, a second PMOS transistor, a third PMOS transistor and a fourth PMOS transistor, wherein the drain of the first NMOS transistor is respectively connected with the drain of the fourth NMOS transistor, the drain of the first PMOS transistor, the drain of the second PMOS transistor, the gate of the fifth NMOS transistor and the gate of the third PMOS transistor; the drain of the second NMOS transistor is connected with the drain of the fifth NMOS transistor, the drain of the third PMOS transistor, the drain of the fourth PMOS transistor, the gate of the fourth NMOS transistor and the gate of the second PMOS transistor, respectively; the source of the first PMOS transistor, the source of the second PMOS transistor, the source of the third PMOS transistor and the source of the fourth PMOS transistor are respectively connected with the Vdd; and the gate of the first PMOS transistor and the gate of the fourth PMOS transistor are respectively connected with the input end of the delay unit, the output end of the delay unit is connected with the gate of the third NMOS transistor, and the drain of the third NMOS transistor is respectively connected with the source of the fourth NMOS transistor and the source of the fifth NMOS transistor; and the source of the third NMOS transistor is grounded.

Due to the adoption of the above technical solution, the present invention has the following beneficial technical effects.

1. An output end Dip/Din of an input transistor is respectively connected to the drains of the NMOS transistors P4 and P5, and connected to the drains of the PMOS transistors P7 and P8, so that the advantage of high speed of this latch is fully exerted.

2. The output signal is generated through the XNOR gate from comparator output signals Dp and Dn, and from this output signal and the control signal clk1, the control signal of the NMOS transistor P10 is generated through the AND gate, so that the problem of static power consumption in the conventional comparator is solved.

3. The present invention is simple in structure, has no obvious area increase compared with the conventional comparator, and achieves the purposes of high speed and low power consumption.

BRIEF DESCRIPTION OF THE DRAWINGS

In order to make objects, technical solutions and advantages of the present invention more comprehensible, the present invention will be further described in detail below with reference to accompanying drawings in which.

DETAILED DESCRIPTION

Preferred embodiments of the present invention will be described in detail below with reference to accompanying drawings. It should be understood that the preferred embodiments are only intended to illustrate the present invention, but not limit the scope of protection of the present invention.

In order to understand the technical solution of the present invention in more detail, operating principles and advantages and disadvantages of several conventional comparators will be firstly analyzed.

Figure 1:
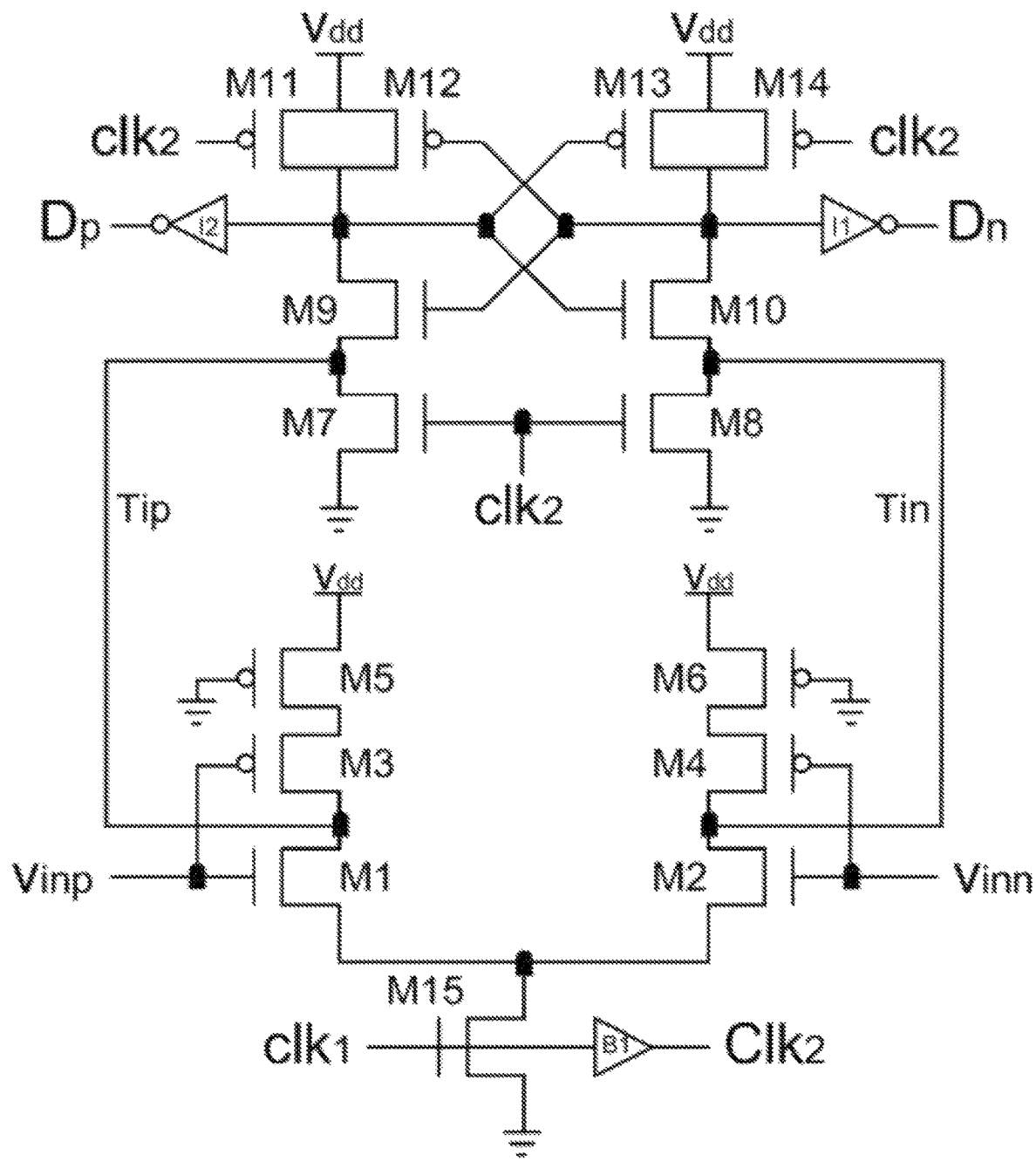
FIG. 1 is a schematic view showing a structure of a high-speed low-offset dynamic comparator.

FIG. 1 shows a schematic view showing a structure (referred to as a structure [1]) of a high-speed low-offset dynamic comparator. When a control signal clk1 is at a low level, a clk2 as a delayed signal of the clk1 is at a low level as well, NMOS transistors M7/M8/M15 are in an off state, PMOS transistors M11/M14 are in an on state, comparator output signals Dp and Dn are at a low level through inverters I1/I2, and the comparator is in a reset state; after the clk1/clk2 becomes a high level, the NMOS transistors M7/M8/M15 are in an on state, and a latch composed of NMOS transistors M9/M10 and PMOS transistors M12/M13 rapidly amplifies a voltage difference between Tip and Tin and enters a latched state. The structure [1] has the advantages of smaller offset and lower noise due to the adoption of an inverter input structure compared with a conventional NMOS input structure. However, the structure [1] has the disadvantages that the output ends Tip and Tin of the input stage inverter are connected to sources of M9/M10 of the latch structure, so that only the M9 and the M10 operate while the M12 and the M13 do not operate at the beginning of establishing a positive feedback by the latch structure, this latching principle does not maximize the advantages of the latch structure, making the comparator slow. Meanwhile, since an input stage employs the inverter input structure, when the structure is in the latched state, the input stage still has a static current, so that there is static power consumption.

Figure 2:
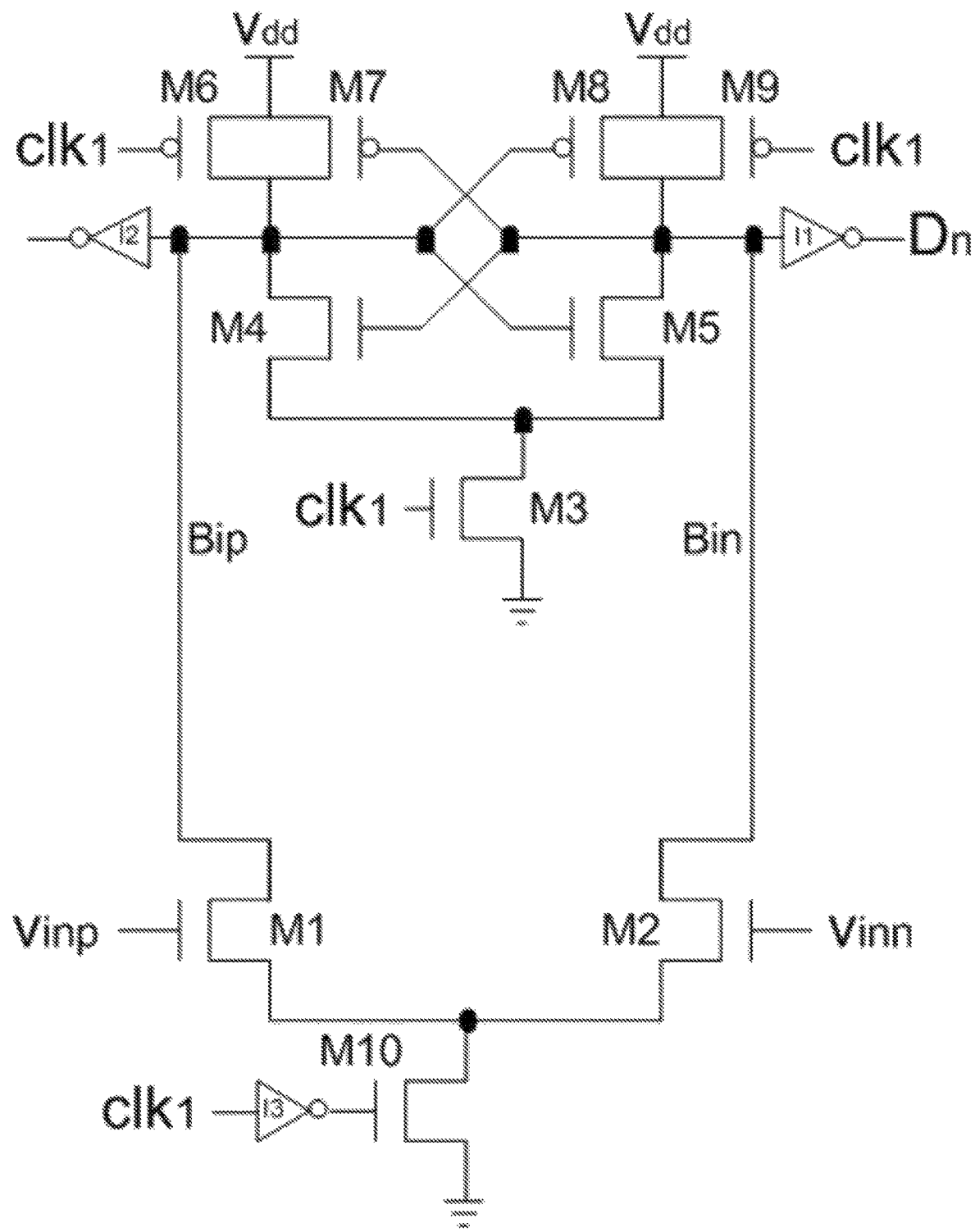
FIG. 2 is a schematic view showing a structure of a high-speed low-noise dynamic comparator.

FIG. 2 shows a schematic view showing a structure (referred to as a structure [2]) of a high-speed low-noise dynamic comparator. When a control signal clk1 is at a low level, a NMOS transistor M3 is in an off state, a NMOS transistor M10 is in an on state, PMOS transistors M6/M9 is in an on state, comparator output signals Dp and Dn are at a low level through inverters I1/I2, and the comparator is in a reset state; after the clk1 becomes a high level, the M10 is in an off state, the M3 is in an on state, and a latch composed of NMOS transistors M4/M5 and PMOS transistors M7/M8 rapidly amplifies a voltage difference between Bip and Bin and enters a latched state. It should be noted that the output ends Bip and Bin of the input stage in FIG. 2 are respectively connected with drains of the M4 and a M5, so that the M4/M5 and the M7/M8 simultaneously operate at the beginning of establishing a positive feedback by a latch structure, this latching principle maximizes the advantages of the latch structure, enabling the comparator to be rapidly enter the latched state. However, the disadvantages of the comparator shown in FIG. 2 are also obvious, that is, since the M10, the M6 and the M9 simultaneously enter an on state from their reset state, such a structure has a great static power consumption.

Figure 3:
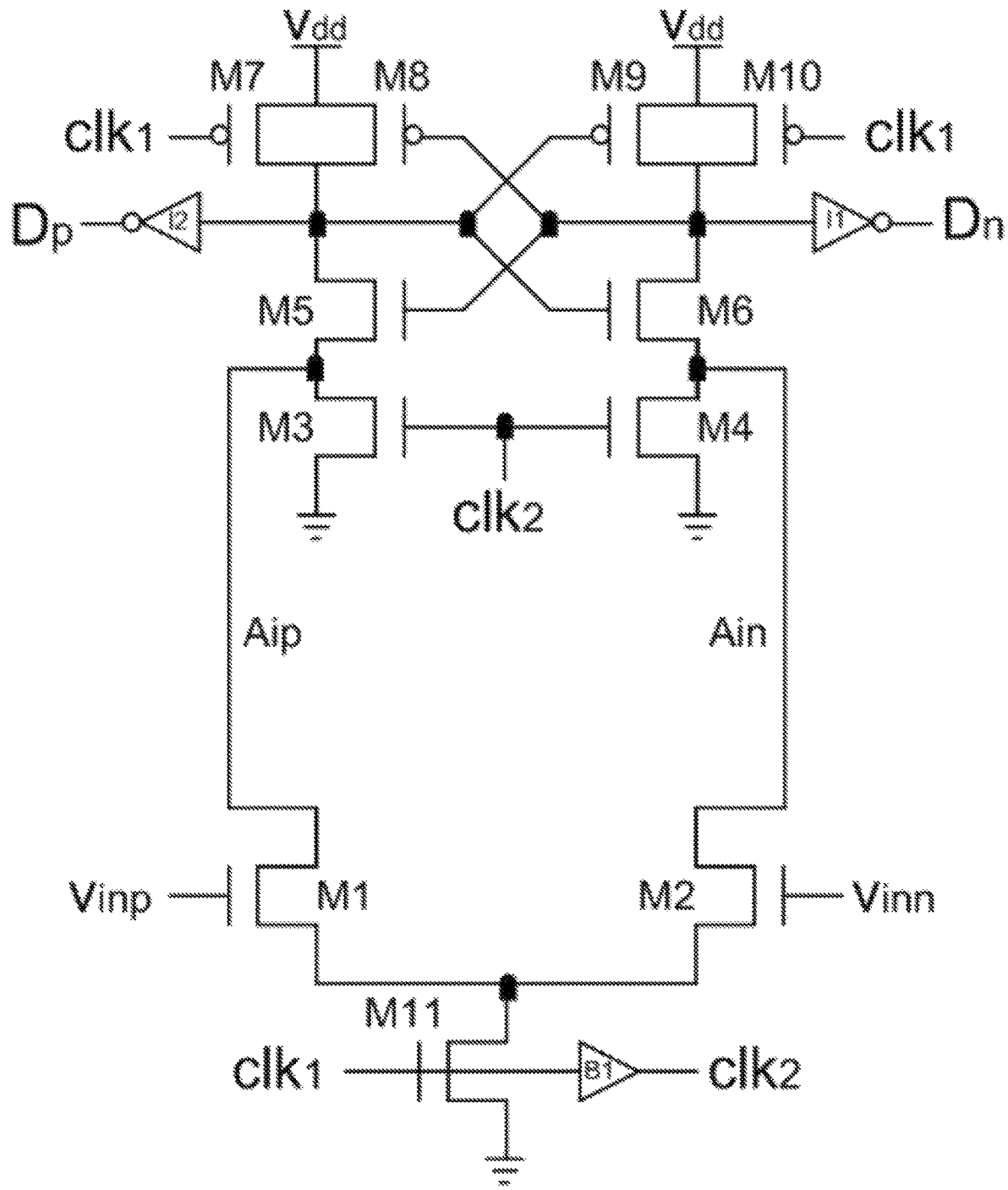
FIG. 3 is a schematic view showing a structure of a low-power-consumption dynamic comparator.

FIG. 3 shows a schematic view showing a structure (referred to as a structure [3]) of a low-power-consumption dynamic comparator. When a control signal clk1 is at a low level, a clk2 as a delayed signal of the clk1 is at a low level as well, NMOS transistors M3/M4/M11 are in an off state, PMOS transistors M7/M10 is in an on state, comparator output signals Dp and Dn are at a low level through inverters I1/I2, and the comparator is in a reset state. After the clk1 becomes a high level, the clk2 will maintain a low level for a period of time, at this time, the M11 is in an on state, the M3/M4 is kept to be in an off state, there is a voltage difference between Aip and Ain, and input transistors M1/M2 are in a saturated state, which helps inhibition of noise; and subsequently, the clk2 also becomes a high level, and a latch composed of NMOS transistors M5/M6 and PMOS transistors M8/M9 rapidly amplifies the voltage difference between the Aip and the Ain and enters a latched state. The structure shown in FIG. 3 has the advantages of smaller equivalent input noise and no static power consumption in both reset and latched states, but disadvantage thereof is similar to that of the structure shown in FIG. 1, that is, the comparator is low in speed.

Figure 4:
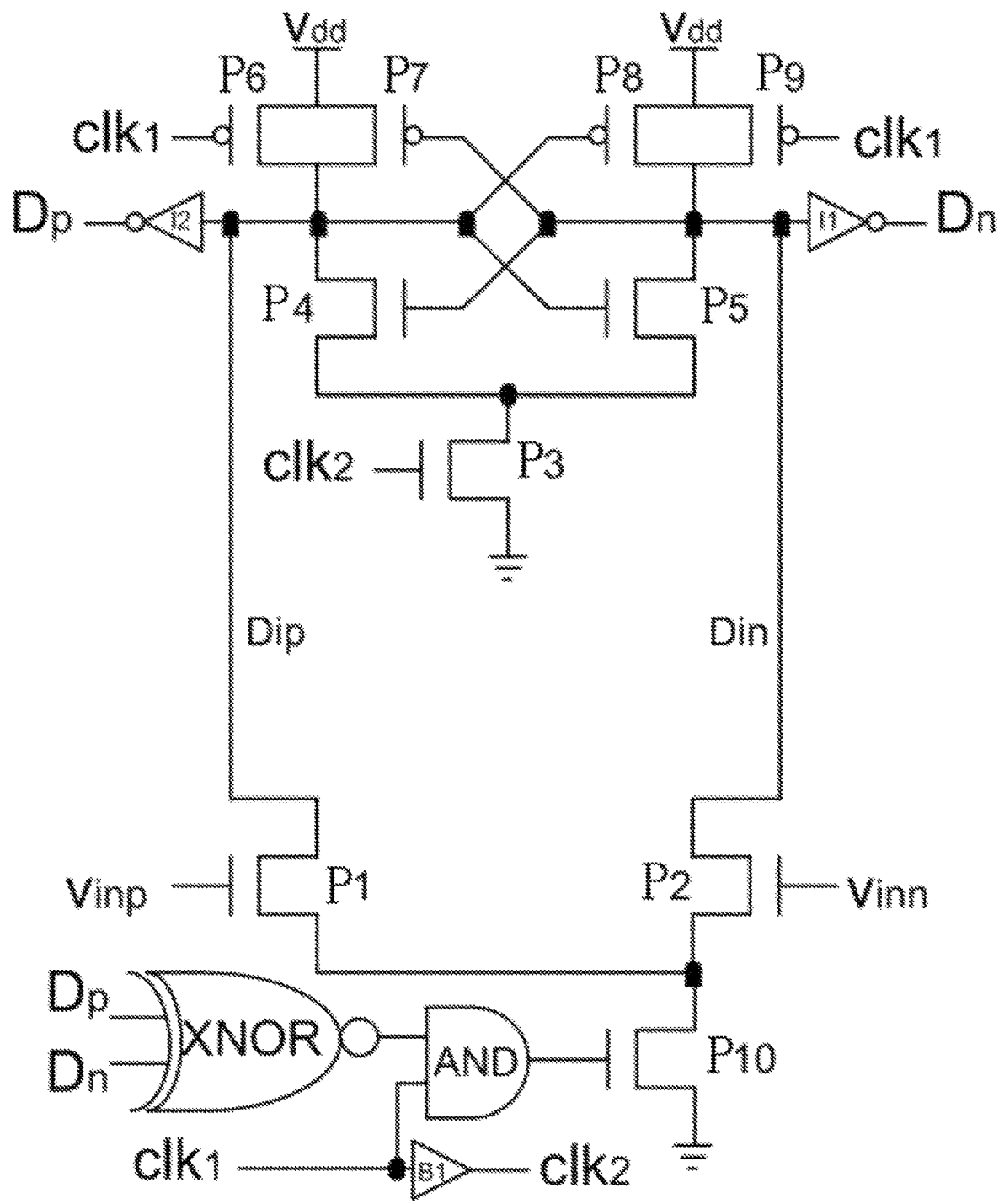
FIG. 4 is a schematic view showing a structure of a high-speed low-power-consumption dynamic comparator.

A schematic view showing a structure of a high-speed low-power-consumption dynamic comparator proposed by the present invention is shown in FIG. 4.

A high-speed low-power-consumption dynamic comparator includes a first NMOS transistor P1, a second NMOS transistor P2, a sixth NMOS transistor P10, a delay unit B1, a first inverter I1, a second inverter I2, an XNOR gate, an AND gate and a latch, wherein the latch includes a first control end, a second control end, a third control end, a first output end (outputs a first output signal), a second output end (outputs a second output signal) and a power supply end; the gate of the first NMOS transistor P1 is connected with a first input signal (Vinp), the gate of the second NMOS transistor P2 is connected with a second input signal (Vinn), and the source of the first NMOS transistor P1 and the source of the second NMOS transistor P2 are respectively connected with the drain of the sixth NMOS transistor P10, and the source of the sixth NMOS transistor P10 is grounded; the drain of the first NMOS transistor P1 is respectively connected with the input end of the second inverter I2 and the second output end of the latch; the drain of the second NMOS transistor P2 is respectively connected with the input end of the first inverter I1 and the first output end of the latch; the output end of the first inverter I1 is connected with one of input ends of the XNOR gate, the output end of the second inverter I2 is connected with the other one of the input ends of the XNOR gate, the output end of the XNOR gate is connected with one of input ends of the AND gate, the input end of the delay unit B1 is connected with the other one of the input ends of the AND gate, and the output end of the AND gate is connected with the gate of the sixth NMOS transistor P10; and the output end of the delay unit B1 is connected with the third control end, the input end of the delay unit is respectively connected with the first control end and the second control end, respectively, and the power supply end is connected with a Vdd.

The latch includes a third NMOS transistor P3, a fourth NMOS transistor P4, a fifth NMOS transistor P5, a first PMOS transistor P6, a second PMOS transistor P7, a third PMOS transistor P8 and a fourth PMOS transistor P9, wherein the drain of the first NMOS transistor P1 is respectively connected with the drain of the fourth NMOS transistor P4, the drain of the first PMOS transistor P6, the drain of the second PMOS transistor P7, the gate of the fifth NMOS transistor P5 and the gate of the third PMOS transistor P8; the drain of the second NMOS transistor P2 is connected with the drain of the fifth NMOS transistor P5, the drain of the third PMOS transistor P8, the drain of the fourth PMOS transistor P9, the gate of the fourth NMOS transistor P4 and the gate of the second PMOS transistor P7, respectively; the source of the first PMOS transistor P6, the source of the second PMOS transistor P7, a source of the third PMOS transistor P8 and a source of the fourth PMOS transistor P9 are respectively connected with the Vdd; and the gate of the first PMOS transistor P6 and the gate of the fourth PMOS transistor P9 are respectively connected with the input end of the delay unit B1, the output end of the delay unit B1 is connected with the gate of the third NMOS transistor P3, and the drain of the third NMOS transistor P3 is respectively connected with the source of the fourth NMOS transistor P4 and the source of the fifth NMOS transistor P5; and the source of the third NMOS transistor P3 is grounded.

In this embodiment, the first PMOS transistor and the fourth PMOS transistor are pull-up PMOS transistors, and the third NMOS transistor and the sixth NMOS transistor are pull-down NMOS transistors.

In this embodiment, an output signal Dp is generated from a first output signal of the latch through the first inverter I1, an output signal Dn is generated from a second output signal of the latch through the second inverter I2, an output signal is generated from Dp and Dn through the XNOR gate, this output signal and the control signal clk1 are taken as input signals of the AND gate, the output signal of the AND gate controls the gate of the P10, and the delayed signal clk2 of the clk1 is generated from the clk1 through the delay unit B1.

The comparator shown in FIG. 4 has two operating states, one is a reset state and the other is a latched state. When the comparator is in the reset state, the control signals clk1 and clk2 are at a low level, the NMOS transistors P3 and P10 are both in an off state, the PMOS transistors P6 and P9 are in an on state, and a signal Dip generated by the first NMOS transistor P1 and a signal Din generated by the second NMOS transistor P2 are pulled up to the power supply voltage Vdd, and the comparator output signals Dp and Dn are at a low level through the inverters I1 and I2; when the comparator enters the latched state, the control signal clk1 becomes a high level, the clk2 as the delayed signal of the clk1 temporarily maintains a low level, at this time, the P10 is in an on state, the P3 is still in an off state, the Dip and the Din start to have a voltage difference therebetween, the P1 and the P2 are in a saturated state, which helps inhibition of the equivalent input noise of the comparator. After a certain delay, the control signal clk2 also becomes a high level, and the voltage difference between the Dip and the Din causes the latch structure composed of the P6, the P7, the P8 and the P9 to quickly enter the latched state, and the comparison is completed, so that the purpose of high-speed operation is achieved. At this time, one of the comparator output signals Dp and Dn is at a high level and the other one is at a low level, they turn off the P10 through the XNOR gate, so that the comparator has no static power consumption in the reset and latched states, so that the purpose of low power consumption is achieved. By way of the above analysis, this structure achieves purposes of both high speed and low power consumption.

On the other hand, as the power supply voltage decreases, the structure of the comparator proposed by the present invention has a higher speed than the above-described conventional structure. The reason is that the structure of the comparator of the present invention saves one source-drain voltage difference Vbs of the NMOS transistor in the latch structure with respect to the structures shown in FIG. 2 and FIG. 3, so that the structure of the comparator proposed by the present invention has a speed advantage in the application of a low power supply voltage.

In order to further verify the above advantages of the present invention, the above various structures are carefully designed in a 65 nm CMOS process. The above four structures employ the same input/output transistor size, the latch structures also employ the same size, and load capacitances are 15 fF.

Figure 5:
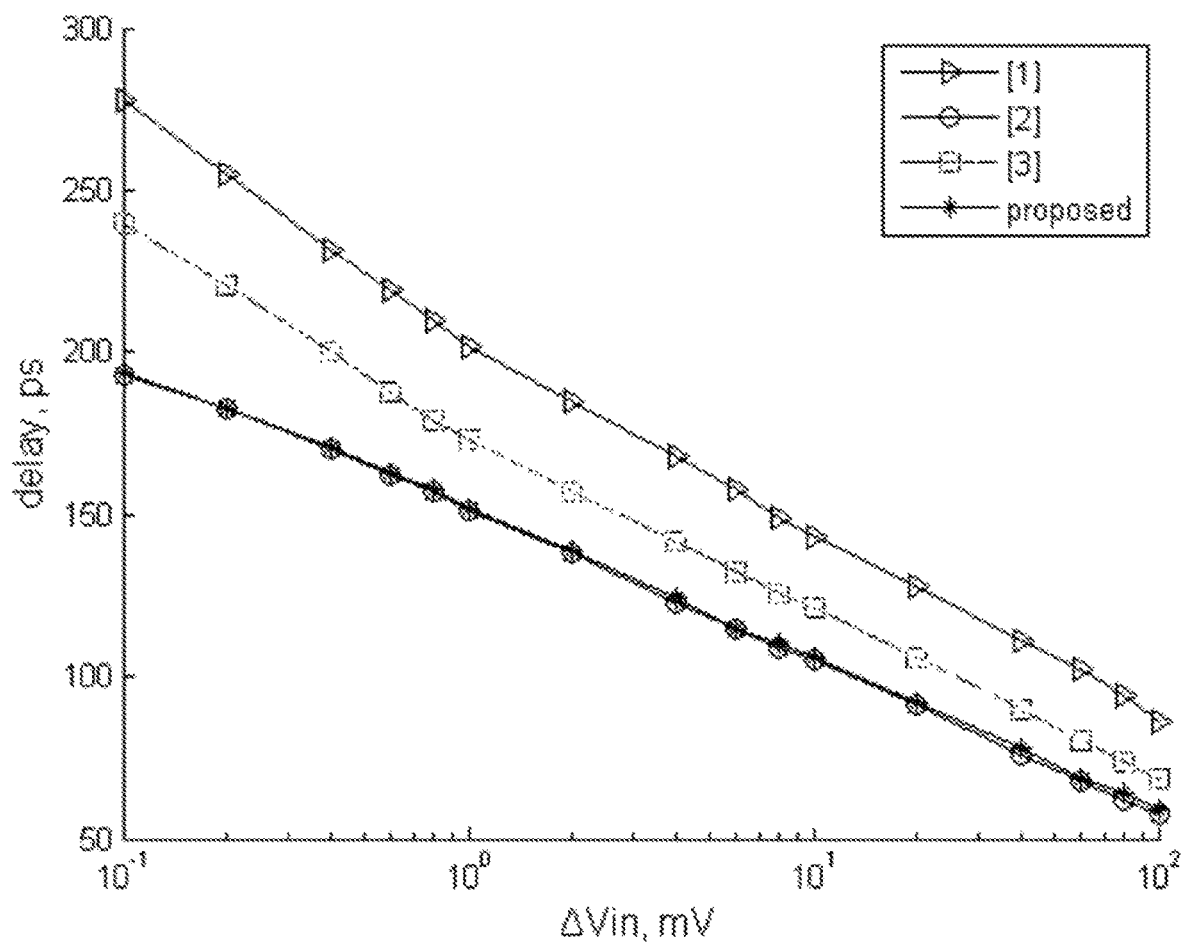
FIG. 5 is a comparison view of comparison time of a comparator over an input signal.

A clock frequency is 1.8 GHz, a power supply voltage is 1.2V, and a common mode voltage is 0.6V. When |Dp−Dn|=0.6V, it is considered that the comparator completes the comparison. Comparison curves of comparison time of comparators adopting the above four structures over an input differential signal ΔVin is shown in FIG. 5.

Figure 6:
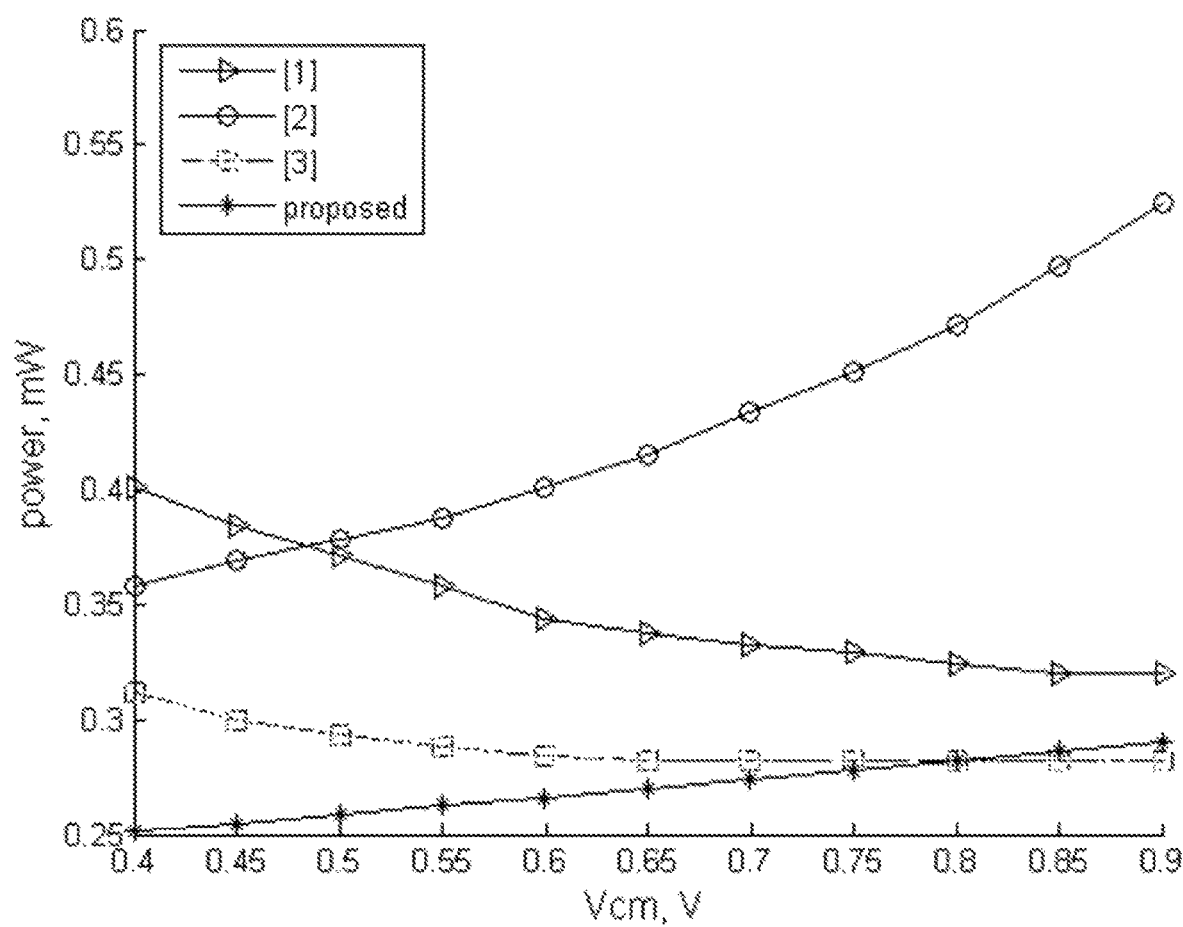
FIG. 6 is a comparison view of power consumption of a comparator over a common mode voltage.

A clock frequency is 1.8 GHz, and a power supply voltage is 1.2V. When |Dp−Dn|=0.6V, it is considered that the comparator completes the comparison. Comparison curves of power-consumption of comparators adopting the above four structures over a common mode voltage Vcm is shown in FIG. 6.

Figure 7:
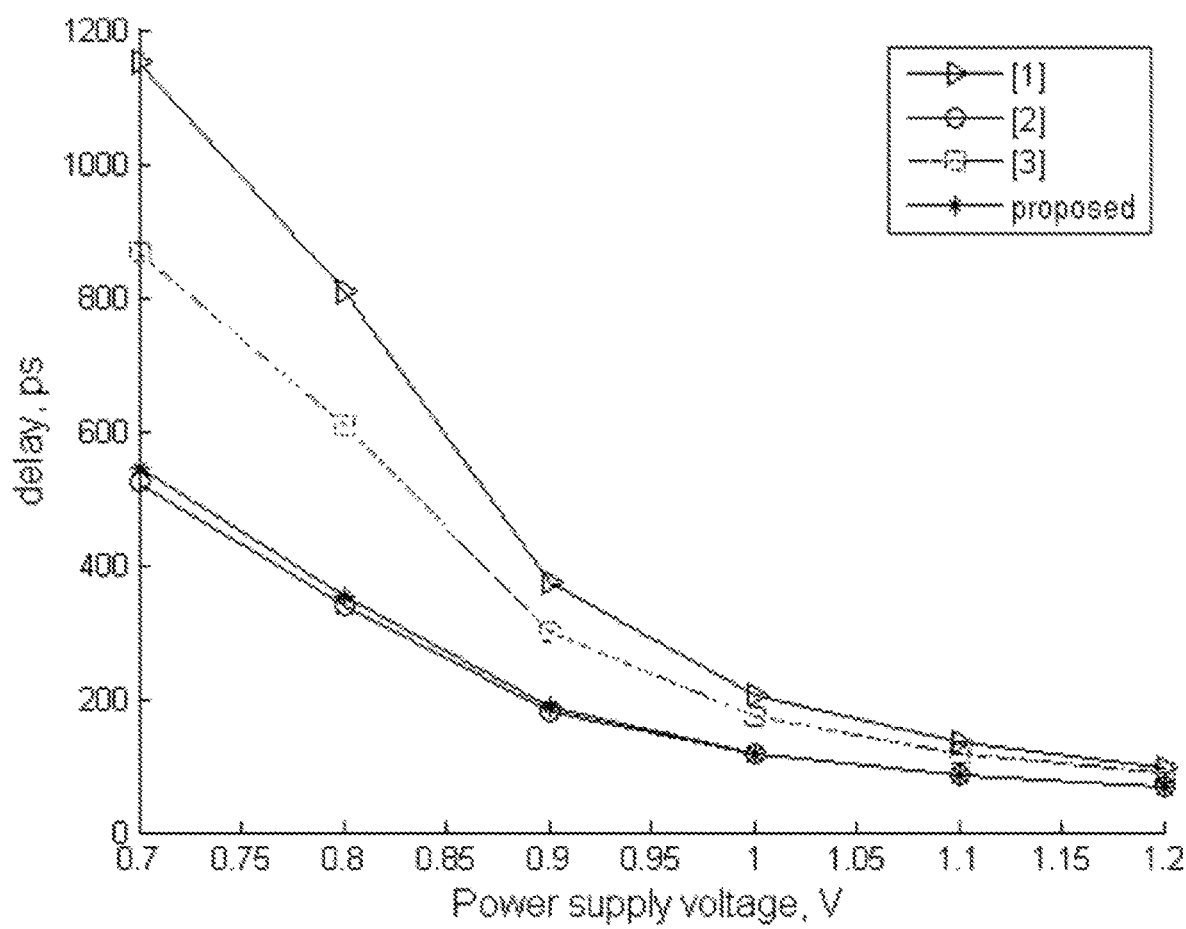
FIG. 7 is a comparison view of comparison time of a comparator over a power supply voltage.

A clock frequency is 0.4 GHz, and an input differential voltage ΔVin is 50 mV. When |Dp−Dn|=0.5 Vdd, it is considered that the comparator completes the comparison. Comparison curves of comparison time of comparators adopting the above four structures over a power supply voltage Vdd is shown in FIG. 7.

The comparison of simulation results of several other indicators of the comparator is shown in the following table. As can be seen from the table, the present invention has several indicators in a medium range compared with the conventional several structures.

|  | [1] | [2] | [3] | Proposed |
|---|---|---|---|---|
| Delay sensitivity, ps/dec | 76 | 55 | 81 | 55 |
| Input-referred noise, μV | 363 | 435 | 379 | 398 |
| Offset, mV | 5.1 | 6.3 | 5.4 | 5.8 |
| Power consumption @ ΔVin = 1 mV, mW | 0.344 | 0.551 | 0.288 | 0.252 |

[1] [2] [3] in the table respectively represent FIG. 1, FIG. 2 and FIG. 3, and "proposed" represents the present invention.

It may be seen from the above simulation results that the structure of the high-speed low-power-consumption comparator proposed by the present invention has a speed increase of at least 30% and a power consumption reduction of at least 15% as compared with the conventional structure.

The above is only a preferred embodiment of the present invention, and is not intended to limit the present invention. It is obvious that those skilled in the art may make various modifications and changes to the present invention without departing from the spirit and scope of the invention. In this way, it is intended that the present invention encompasses such modifications and variations if these modifications and variations of the present invention are intended to be included within the scope of the claims and equivalents thereof of the present invention.

What is claimed is:

1. A high-speed low-power-consumption dynamic comparator, comprising a first NMOS transistor, a second NMOS transistor, a sixth NMOS transistor, a delay unit, a first inverter, a second inverter, an XNOR gate, an AND gate and a latch, wherein the latch comprises a first control end, a second control end, a third control end, a first output end, a second output end and a power supply end; the gate of the first NMOS transistor is connected with a first input signal, the gate of the second NMOS transistor is connected with a second input signal, and the source of the first NMOS transistor and the source of the second NMOS transistor are respectively connected with the drain of the sixth NMOS transistor, and the source of the sixth NMOS transistor is grounded; the drain of the first NMOS transistor is respectively connected with the input end of the second inverter and the second output end of the latch; the drain of the second NMOS transistor is respectively connected with the input end of the first inverter and the first output end of the latch; the output end of the first inverter is connected with one of input ends of the XNOR gate, the output end of the second inverter is connected with the other one of the input ends of the XNOR gate, the output end of the XNOR gate is connected with one of input ends of the AND gate, the input end of the delay unit is connected with the other one of the input ends of the AND gate, and the output end of the AND gate is connected with the gate of the sixth NMOS transistor; and the output end of the delay unit is connected with the third control end, the input end of the delay unit is respectively connected with the first control end and the second control end, respectively, and the power supply end is connected with a Vdd.

2. The high-speed low-power-consumption dynamic comparator according to claim 1, wherein the latch comprises a third NMOS transistor, a fourth NMOS transistor, a fifth NMOS transistor, a first PMOS transistor, a second PMOS transistor, a third PMOS transistor and a fourth PMOS transistor, wherein the drain of the first NMOS transistor is respectively connected with the drain of the fourth NMOS transistor, the drain of the first PMOS transistor, the drain of the second PMOS transistor, the gate of the fifth NMOS transistor and the gate of the third PMOS transistor; the drain of the second NMOS transistor is connected with the drain of the fifth NMOS transistor, the drain of the third PMOS transistor, the drain of the fourth PMOS transistor, the gate of the fourth NMOS transistor and the gate of the second PMOS transistor, respectively; the source of the first PMOS transistor, the source of the second PMOS transistor, the source of the third PMOS transistor and the source of the fourth PMOS transistor are respectively connected with the Vdd; and the gate of the first PMOS transistor and the gate of the fourth PMOS transistor are respectively connected with the input end of the delay unit, the output end of the delay unit is connected with the gate of the third NMOS transistor, and the drain of the third NMOS transistor is respectively connected with the source of the fourth NMOS transistor and the source of the fifth NMOS transistor; and the source of the third NMOS transistor is grounded.

* * * * *